United States Patent
Kambayashi et al.

(10) Patent No.: US 9,875,899 B2
(45) Date of Patent: Jan. 23, 2018

(54) SEMICONDUCTOR TRANSISTOR (75) Inventors: Hiroshi Kambayashi, Yokohama (JP);
Katsunori Ueno, Yokohama (JP);
Takehiko Nomura, Yokohama (JP);
Yoshihiro Sato, Yokohama (JP);
Akinobu Teramoto, Sendai (JP);
Tadahiro Ohmi, Sendai (JP)

(73) Assignees: FUJI ELECTRIC CO., LTD., Kanagawa (JP); TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 13/582,229

(22) PCT Filed: Mar. 2, 2011

(86) PCT No.: PCT/JP2011/054815
§ 371 (c)(1),
(2), (4) Date: Oct. 15, 2012

(87) PCT Pub. No.: WO2011/108615
PCT Pub. Date: Sep. 9, 2011

(65) Prior Publication Data
US 2013/0032819 A1 Feb. 7, 2013

(30) Foreign Application Priority Data
Mar. 2, 2010 (JP) ................................. 2010-045547

(51) Int. Cl.
H01L 21/28 (2006.01)
H01L 29/51 (2006.01)
(Continued)

(52) U.S. Cl.
CPC ...... *H01L 21/28264* (2013.01); *C23C 16/403* (2013.01); *C23C 16/4488* (2013.01);
(Continued)

(58) Field of Classification Search
CPC ..... H01L 29/78; H01L 21/336; H01L 29/786; H01L 21/316; H01L 21/28264;
(Continued)

(56) References Cited

U.S. PATENT DOCUMENTS

2002/0096692 A1* 7/2002 Nakamura et al. ........... 257/194
2002/0119610 A1* 8/2002 Nishii ............... H01L 21/28264
438/167
(Continued)

FOREIGN PATENT DOCUMENTS

JP 2001308319 A 11/2001
JP 2007-165493 A 6/2007
(Continued)

OTHER PUBLICATIONS

International Search Report and Written Opinion for PCT/JP2011/054815 dated Apr. 5, 2011.
(Continued)

*Primary Examiner* — David Vu
*Assistant Examiner* — Mouloucoulaye Inoussa
(74) *Attorney, Agent, or Firm* — Hauptman Ham, LLP (57) ABSTRACT

The semiconductor transistor according the present invention includes an active layer composed of a GaN-based semiconductor and a gate insulating film formed on the active layer. The gate insulating film has a first insulating film including one or more compounds selected from the group consisting of $Al_2O_3$, $HfO_2$, $ZrO_2$, $La_2O_3$, and $Y_2O_3$ formed on the active layer, and a second insulating film composed of $SiO_2$ formed on the first insulating film.

17 Claims, 5 Drawing Sheets (51) Int. Cl.
- *H01L 29/78* (2006.01)
- *H01L 21/02* (2006.01)
- *C23C 16/40* (2006.01)
- *C23C 16/448* (2006.01)
- *H01L 29/20* (2006.01)

(52) U.S. Cl.
CPC .. *H01L 21/02178* (2013.01); *H01L 21/02277* (2013.01); *H01L 29/513* (2013.01); *H01L 29/517* (2013.01); *H01L 29/78* (2013.01); *H01L 29/2003* (2013.01)

(58) Field of Classification Search
CPC ............. H01L 29/513; H01L 21/02178; H01L 29/7783; H01L 29/66462; H01L 29/2003
USPC ............. 257/287, 316, 369, E29.129, E29.3, 257/E21.179; 438/285, 287, 767, 104, 438/591, 167, 197, 183, 184, 143, 172, 438/180, 181, 182, 585, 168, 169, 170, 438/171, 173, 174, 175, 176, 177, 178, 438/179, 199, 211
See application file for complete search history.

(56) References Cited

U.S. PATENT DOCUMENTS

| | | | | |
|---|---|---|---|---|
| 2008/0099767 | A1* | 5/2008 | Shakuda | ............. H01L 29/0847 257/76 |
| 2010/0117118 | A1* | 5/2010 | Dabiran et al. | ............... 257/190 |
| 2010/0159656 | A1 | 6/2010 | Nakata et al. | |
| 2011/0024845 | A1* | 2/2011 | Hirai | ................. H01L 21/28079 257/369 |
| 2011/0156005 | A1* | 6/2011 | Pillarisetty | ............ H01L 29/165 257/24 |

FOREIGN PATENT DOCUMENTS

| | | |
|---|---|---|
| JP | 2008053554 A | 3/2008 |
| JP | 2008103408 A | 5/2008 |
| JP | 2008277640 A | 11/2008 |
| JP | 2009059946 A | 3/2009 |
| JP | 2009302435 A | 12/2009 |

OTHER PUBLICATIONS

Office Action dated Mar. 12, 2015, corresponding to Chinese patent application No. 201180011856.3.

P. D. Ye et al., "GaN metal-oxide-semiconductor high-electron-mobility-transistor with atomic layer deposited AL2O3 as gate dielectric", Applied Physical Letters, Jan. 31, 2005, pp. 063501-1 to 063501-3, vol. 86, No. 6.

Office Action dated Sep. 1, 2015, corresponding to Chinese Patent Application No. 201180011856.3.

Extended European Search Report dated Jul. 26, 2013 corresponds to EP Patent application No. 11750724.4.

* cited by examiner

SEMICONDUCTOR TRANSISTOR

RELATED APPLICATIONS

The present application is a National Phase of International Application No. PCT/JP2011/054815, filed Mar. 2, 2011, and claims priority from Japanese Application No. 2010-045547, filed Mar. 2, 2010.

TECHNICAL FIELD

The present invention relates to a semiconductor transistor, and more particularly to a semiconductor transistor having an active layer made of a GaN-based semiconductor.

BACKGROUND ART

A gallium nitride-based semiconductor transistor (hereinafter, referred to as a GaN-based semiconductor transistor) has, for example, an active layer composed of a GaN-based semiconductor and a gate insulating film formed on the active layer. As the gate insulating film, for example, $SiO_2$, $Al_2O_3$, SiNx, GaOx, or $HfO_2$ is used.

In the GaN-based semiconductor transistor, it is known that when $SiO_2$ is used for the gate insulating film, the Si of the $SiO_2$ diffuses into the GaN. In contrast, Japanese Patent Application Laid-Open (JP-A) No. 2008-277640 describes a technique in which, for a gate insulating film, $Al_2O_3$ is used alone instead of $SiO_2$.

The technique disclosed in JP-A No. 2008-277640 can prevent the Si of the $SiO_2$ from diffusing into the GaN. However, a gate insulating film composed of $Al_2O_3$ has poorer film characteristics than a gate insulating film composed of $SiO_2$. The poorer film characteristics mean, for example, that leaked electric current is high, breakdown voltage is low, and the like.

SUMMARY OF INVENTION

Technical Problem

The present inventors have found that when $SiO_2$ is used for a gate insulating film in a GaN-based semiconductor transistor, there occurs a mutual diffusion phenomenon in which not only does the Si of the $SiO_2$ diffuse into the GaN, but also, conversely, an impurity diffuses from the GaN into the $SiO_2$. When the mutual diffusion phenomenon occurs, the interface state increases, and the interface characteristics between the GaN-based semiconductor and the gate insulating film deteriorate. As a result of intensive and extensive investigations, the present inventors have found that the mutual diffusion phenomenon is attributable to the oxidization power of a compound that forms a gate insulating film.

The present inventors have also found that it is not enough for the compound that forms the gate insulating film to merely have a wider Eg (band gap) than the GaN that forms the active layer, and that the presence of ΔEc (a conduction band barrier) and ΔEv (a valence band barrier) is necessary.

Meanwhile, a GaN-based semiconductor is one kind of so-called wide band gap semiconductors and is expected to be used in a high temperature environment. Assuming the use in a high temperature environment, examples of the compound that forms the gate insulating film of the GaN-based semiconductor transistor include $SiO_2$ and $Al_2O_3$, which have a wider band gap than the GaN-based semiconductor and have good high-temperature characteristics.

$Al_2O_3$ has a stronger oxidization power than $SiO_2$. Therefore, formation of a gate insulating film from $Al_2O_3$ prevents, for example, diffusion of impurity from the GaN-based semiconductor into the $Al_2O_3$, thereby improving interface characteristics, even in a high temperature environment. However, it is difficult to provide an $Al_2O_3$ with excellent film quality.

$SiO_2$ has a wider band gap than $Al_2O_3$ and thus the breakdown voltage is high and the film quality is good. However, since $SiO_2$ exhibits lower oxidization power than $Al_2O_3$, due to impurity diffusion or the like, interface characteristics are not favorable. Therefore, in GaN-based semiconductor transistors, even with the use of $SiO_2$ or $Al_2O_3$ for a gate insulating film, it has been difficult to improve both the interface characteristics between the GaN-based semiconductor and the gate insulating film and the film characteristics of the gate insulating film.

JP-A No. 2008-103408 describes a GaN-based semiconductor transistor in which a first gate insulating film composed of SiNx is formed on a GaN-based semiconductor, and a second gate insulating film composed of $Al_2O_3$ or $SiO_2$, which have greater breakdown strength than SiNx, is formed on the first gate insulating film.

In JP-A No. 2008-103408, the gate insulating film is formed as a composite film (hybrid film), with the intention of providing favorable interface characteristics between a first gate insulating film in the GaN-based semiconductor and the gate insulating film and obtaining a high breakdown voltage in a second gate insulating film. However, the band gap of SiNx is 5.3 eV, which is not wide enough compared to the band gap (Eg=3.3 ev) of GaN, and ΔEv is extremely small. Therefore, even when SiNx is used for the gate insulating film of the GaN-based semiconductor, it can be said that it is difficult to provide both favorable interface characteristics between the GaN-based semiconductor and the gate insulating film and favorable film characteristics of the gate insulating film.

An object of the present invention is to provide a semiconductor transistor that has both favorable interface characteristics between a GaN-based semiconductor and a gate insulating film and favorable film characteristics of the gate insulating film.

To achieve the object, the present invention provides a semiconductor transistor that includes an active layer composed of a GaN-based semiconductor; and a gate insulating film having a first insulating film including one or more compounds selected from the group consisting of insulating films in which an absolute value of standard enthalpy of formation is larger than 228 kJ/mol, and a second insulating film composed of $SiO_2$ formed on the first insulating film.

In addition, a semiconductor transistor that includes an active layer composed of a GaN-based semiconductor; and a gate insulating film having a first insulating film including one or more compounds selected from the group consisting of $Al_2O_3$, $HfO_2$, $ZrO_2$, $La_2O_3$, and $Y_2O_3$, and a second insulating film composed of $SiO_2$ formed on the first insulating film, is also provided.

Advantageous Effects of Invention

The semiconductor transistor according to the present invention has both favorable interface characteristics between the GaN-based semiconductor and the gate insulating film and favorable film characteristics of the gate insulating film.

BRIEF DESCRIPTION OF DRAWINGS

FIG. 6C is a view showing the process of producing the GaN-based semiconductor transistor according to the embodiment of the present invention.

DESCRIPTION OF EMBODIMENTS

Figure 1:
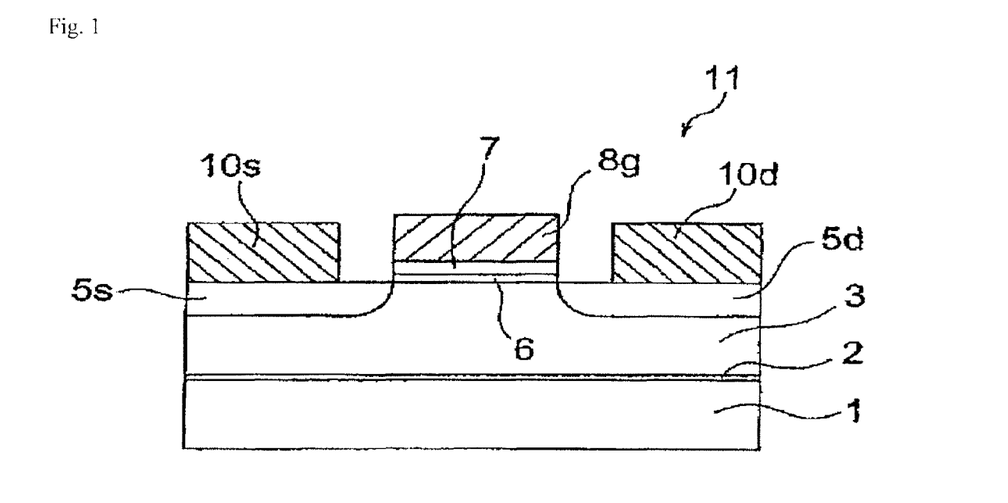
FIG. 1 is a cross-sectional view showing a configuration of the GaN-based semiconductor transistor according to an embodiment of the invention.

Hereinafter, an exemplary embodiment of the present invention is described in detail with reference to the drawings. FIG. 1 is a cross-sectional view showing a configuration of a semiconductor transistor according to an embodiment of the present invention. A semiconductor transistor 11 is a GaN-based semiconductor transistor having an active layer composed of a GaN-based semiconductor. The semiconductor transistor 11 has a buffer layer 2 formed on a substrate 1, a p-type active layer (p-GaN) 3 formed on the buffer layer 2 using a group-III nitride semiconductor, and a gate insulating film composed of a first insulating film 6 and a second insulating film 7 formed on the active layer 3.

Furthermore, the semiconductor transistor 11 includes a gate electrode 8g which is provided on the active layer 3 with the gate insulating film therebetween, and an n+ type source region 5s and an n+ type drain region 5d, which are provided suitably for the gate electrode 8g and are in ohmic contact with a source electrode 10s and a drain electrode 10d, respectively.

Here, the gate insulating film is described. The gate insulating film is a hybrid film composed of the first insulating film 6 and the second insulating film 7. The first insulating film 6 is formed on the active layer 3 and includes one or more compounds selected from the group consisting of $Al_2O_3$, $HfO_2$, $ZrO_2$, $La_2O_3$, and $Y_2O_3$. The second insulating film 7 is formed on the first insulating film 6 and is composed of $SiO_2$.

The present inventors have found that when $SiO_2$ is used for a gate insulating film in a GaN-based semiconductor transistor, not only does the Si of the $SiO_2$ diffuse into the GaN, but also, conversely, a mutual diffusion phenomenon in which an impurity diffuses from the GaN into the $SiO_2$ occurs, and furthermore, that the mutual diffusion phenomenon is attributable to the oxidization power of the compound that forms the gate insulating film. When the mutual diffusion phenomenon occurs, the interface state increases, whereby the interface characteristics between the GaN-based semiconductor and the gate insulating film deteriorate. Therefore, to suppress the mutual diffusion phenomenon, it is necessary to use a compound having a higher oxidization power than $SiO_2$ for the gate insulating film.

Figure 2:
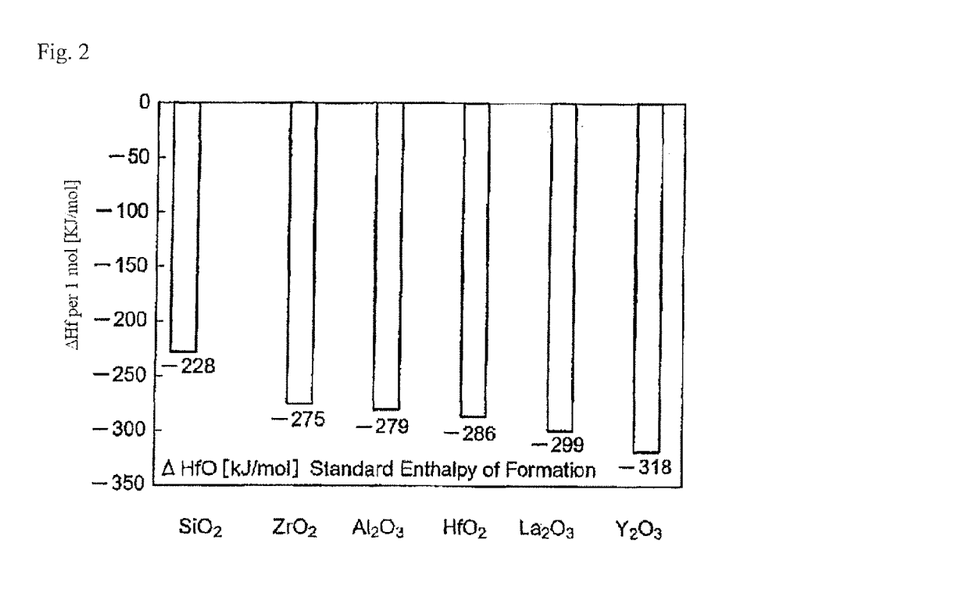
FIG. 2 is an explanatory view exemplifying the oxidization power of respective compounds.

FIG. 2 shows the oxidization power of respective compounds. The oxidization power is represented by a standard enthalpy of formation per 1 mol of metal-oxygen bonding, which is an absolute value of a vertical axis ΔHfO [KJ/mol] in the drawing. As shown in FIG. 2, the oxidization power of $SiO_2$ is 228; the oxidization power of $ZrO_2$ is 275; the oxidization power of $Al_2O_3$ is 279; the oxidization power of $HfO_2$ is 286; the oxidization power of $La_2O_3$ is 299, and the oxidization power of $Y_2O_3$ is 318. Thus, the oxidization power of $Al_2O_3$, $HfO_2$, $ZrO_2$, $La_2O_3$, and $Y_2O_3$ are higher than that of $SiO_2$.

Figure 3:
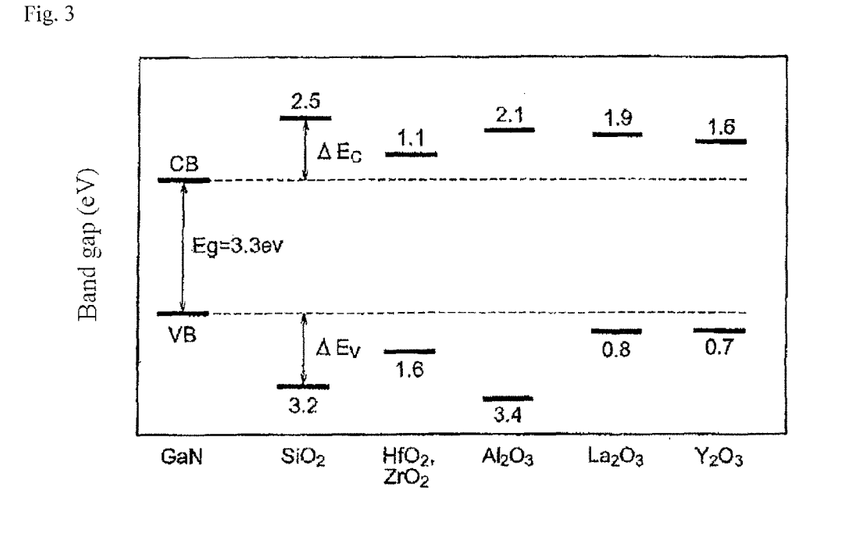
FIG. 3 is an explanatory view exemplifying a band structure of respective compounds.

In addition, the present inventors have also focused on the band structure of a compound, and consequently have found that the compound that forms the gate insulating film of the GaN-based semiconductor transistor has a wider Eg (band gap) than the GaN which forms the active layer 3, and the presence of ΔEc (a conduction band barrier) and ΔEv (a valence band barrier) is necessary. When the compound forming the gate insulating film has a wider Eg than the GaN and the ΔEc and the ΔEv are present, breakdown voltage is high and film characteristics are favorable.

FIG. 3 shows the band structure of each compound. First, GaN is represented by Eg=3.3 ev, based on a CB (conduction band) and a VB (valence band). Regarding $SiO_2$, Eg=9.0 ev can be obtained by adding the values of an ΔEv and an ΔEc to 3.3 ev. Similarly, the Eg of each of $HfO_2$ and $ZrO_2$ is 6.0 ev; the Eg of $Al_2O_3$ is 8.8 ev; the Eg of $La_2O_3$ is 6.0 ev; and the Eg of $Y_2O_3$ is 5.6 ev. Accordingly, it is apparent that the Eg of $SiO_2$ is the largest.

In other words, in the semiconductor transistor 11, the first insulating film 6 was formed with a compound having a higher oxidization power than $SiO_2$ to provide favorable interface characteristics between the gate insulating film and the active layer 3, and the second insulating film 7 was formed with a compound having a wider band gap than the first insulating film 6 to provide favorable film characteristics of the gate insulating film.

Figure 4A:
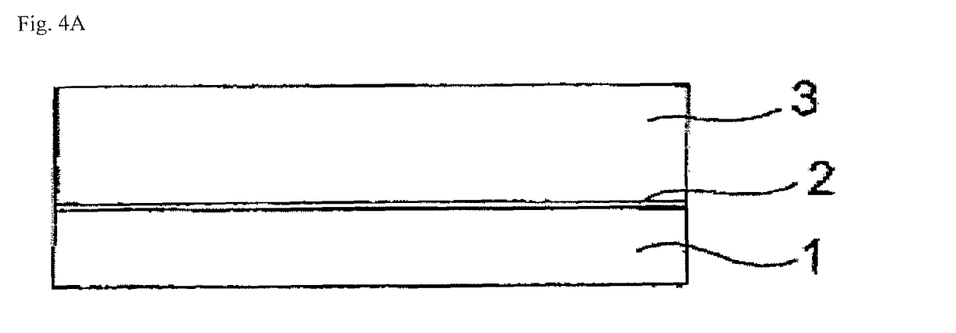
FIG. 4A is a view showing the process of producing the GaN-based semiconductor transistor according to the embodiment of the present invention.

Hereinafter, a method for producing the semiconductor transistor 11 is described. First, as shown in FIG. 4A, the buffer layer 2 composed of AlN or GaN and having a thickness of approximately 20 nm and the p-GaN layer 3 having a thickness of approximately 1 μm are sequentially grown on the substrate 1 made of, for example, sapphire, SiC, Si, GaN or the like by a metal organic chemical vapor deposition (MOCVD) method. For example, Mg is used as a p-type dopant, and the dopant concentration is, for example, set to $1\times10^{16}$ to $1\times10^{17}/cm^3$. The growth of GaN or the like on the substrate 1 is not limited to the MOCVD method, and other growth methods such as a hydride vapor phase epitaxy (HVPE) method or a molecular beam epitaxy (MBE) method may be used.

Figure 4B:
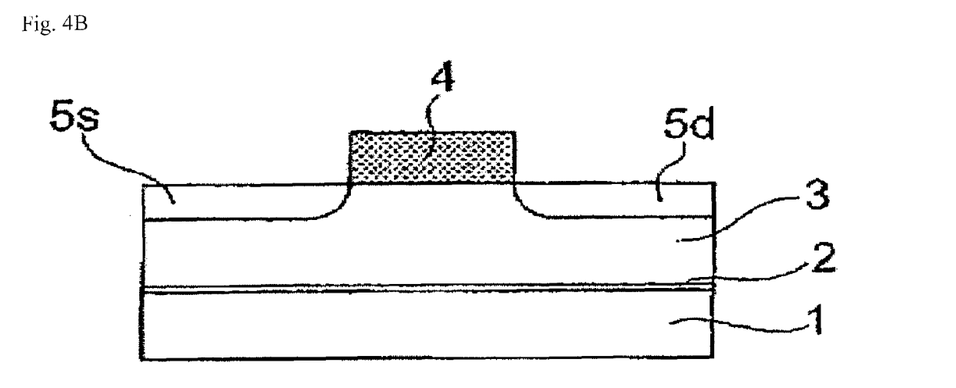
FIG. 4B is a view showing the process of producing the GaN-based semiconductor transistor according to the embodiment of the present invention.

Next, as shown in FIG. 4B, a photoresist 4 is applied to the p-GaN layer 3 and exposed to light and developed to form openings in a source region and a drain region. After that, through the openings, an n-type dopant such as silicon is injected to form the n+ type source region 5s and the n+ type drain region 5d. In this case, the concentration of the n-type dopant is set to, for example, $1\times10^{18}$ to $2\times10^{20}/cm^3$.

Figure 4C:
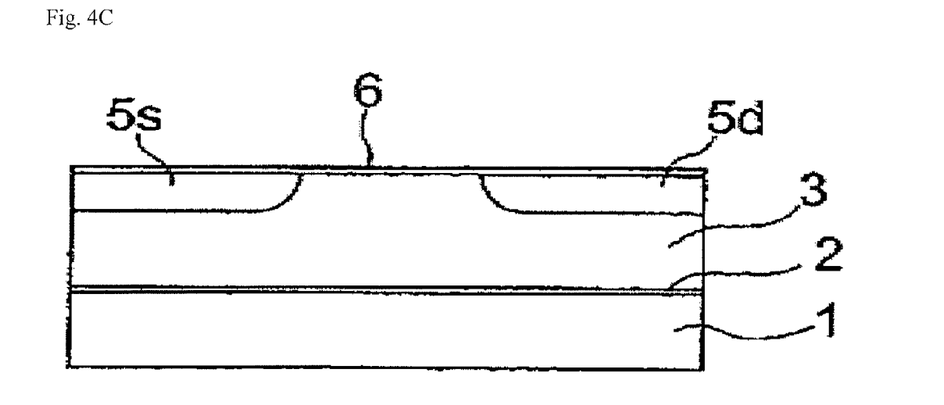
FIG. 4C is a view showing the process of producing the GaN-based semiconductor transistor according to the embodiment of the present invention.

After the photoresist 4 is removed with a solvent, as shown in FIG. 4C, an alumina film ($Al_2O_3$) that is to be the first insulating film 6 is grown so as to have a thickness of, for example, from 5 nm to 10 nm, by a plasma-free catalytic chemical vapor deposition (Cat-CVD) method. The Cat-CVD method is performed, for example, using the film formation apparatus 21 shown in FIG. 5.

Figure 5:
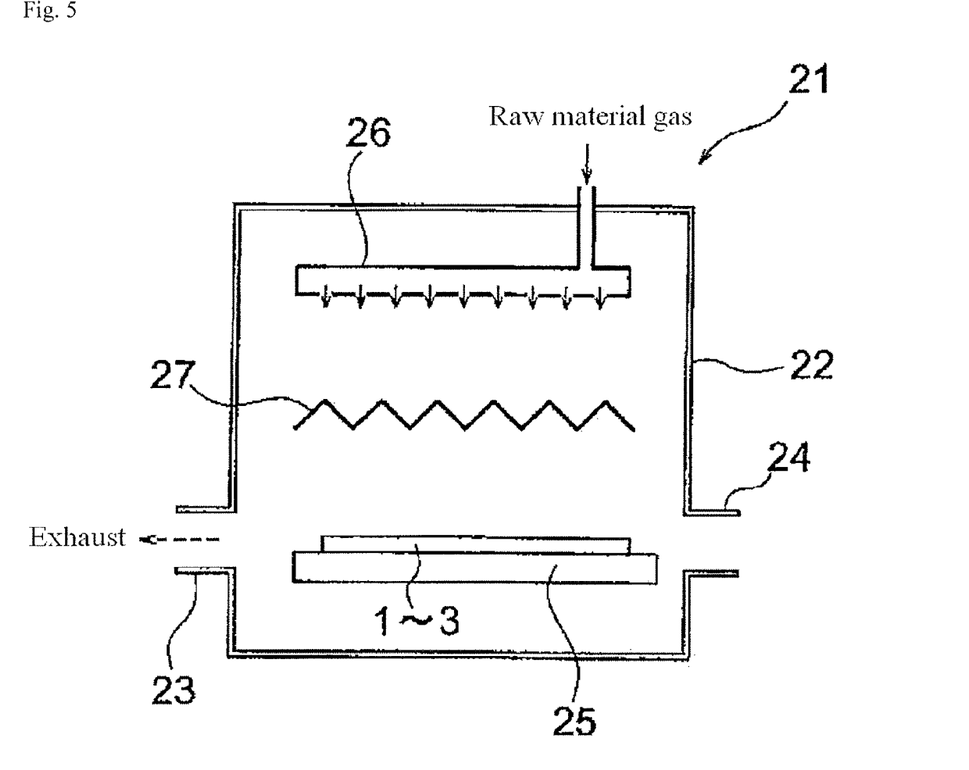
FIG. 5 is a view schematically showing a film-formation apparatus used in the process of producing the GaN-based semiconductor transistor.

The film formation apparatus 21 includes a chamber 22, as shown in FIG. 5. In the chamber 22 an exhaust outlet 23 and a substrate-conveying opening 24 are provided. Additionally, inside the chamber 22 a substrate-mounting table 25 for mounting the substrate 1, a gas-discharging device 26, and a linear catalyst 27 are disposed. The gas-discharging device 26 discharges, to the substrate-mounting table 25, a reaction (raw material) gas which has been introduced from outside. The catalyst 27 is composed of tungsten and is placed between the substrate-mounting table 25 and the gas-discharging device 26.

Here, the substrate 1 on which the p-GaN layer 3 has been formed is mounted on the substrate-mounting table 25, the pressure inside the chamber 22 is reduced, and an electric current is supplied from an alternating current source (not shown) to the catalyst 27 to achieve a state in which the temperature thereof is increased to approximately from 1800° C. to 1900° C. In this state, a raw material gas is discharged from the gas-discharging device 26 to the p-GaN layer 3. The raw material gas is decomposed by the catalyst 27 to produce an active species, whereby the alumina film (first insulating film) 6 is formed on a surface of the p-GaN layer 3.

Figure 4D:
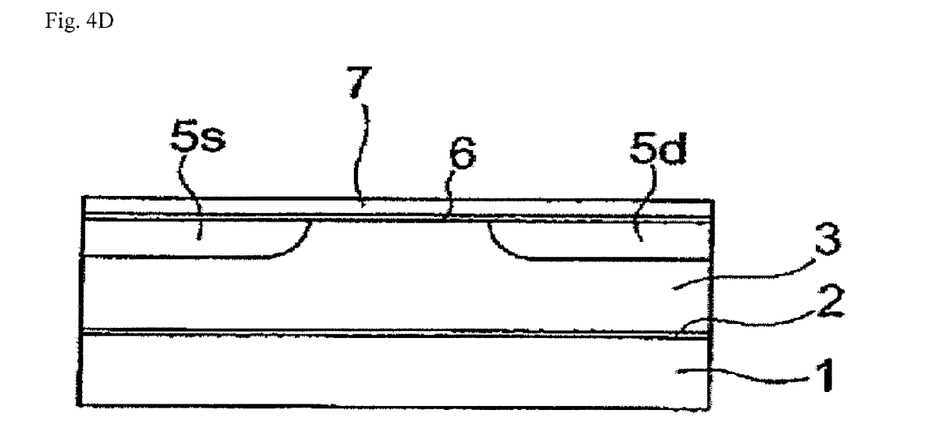
FIG. 4D is a view showing the process of producing the GaN-based semiconductor transistor according to the embodiment of the present invention.

Subsequently, as shown in FIG. 4D, a silicon oxide film ($SiO_2$ film) that is to be the second insulating film 7 is formed, on the alumina film 6, so as to have a thickness of approximately from 50 nm to 100 nm.

Figure 6A:
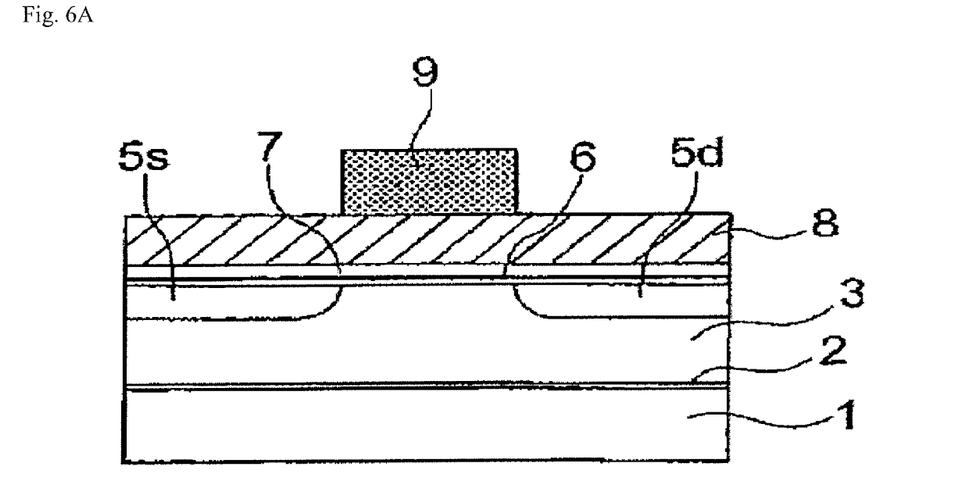
FIG. 6A is a view showing the process of producing the GaN-based semiconductor transistor following on from FIG. 4D, according to the embodiment of the present invention.

Next, as shown in FIG. 6A, a conductive film 8 is formed on the silicon oxide film 7. Polysilicon is generally used for the conductive film 8, but the conductive film 8 is not restricted thereto, and may be a metal film such as Ni/Al or WSi. In the case of using polysilicon, As, P (phosphorous), B (boron), or the like is doped and polysilicon is grown by the CVD method, whereas, in the case of a metal film, it is formed by sputtering or the like.

Furthermore, a photoresist 9 is applied to the conductive film 8, and is exposed to light and developed, as a result of which, the photoresist 9 remains in the gate region, but is removed from the source region 5s and the drain region 5d.

Figure 6B:
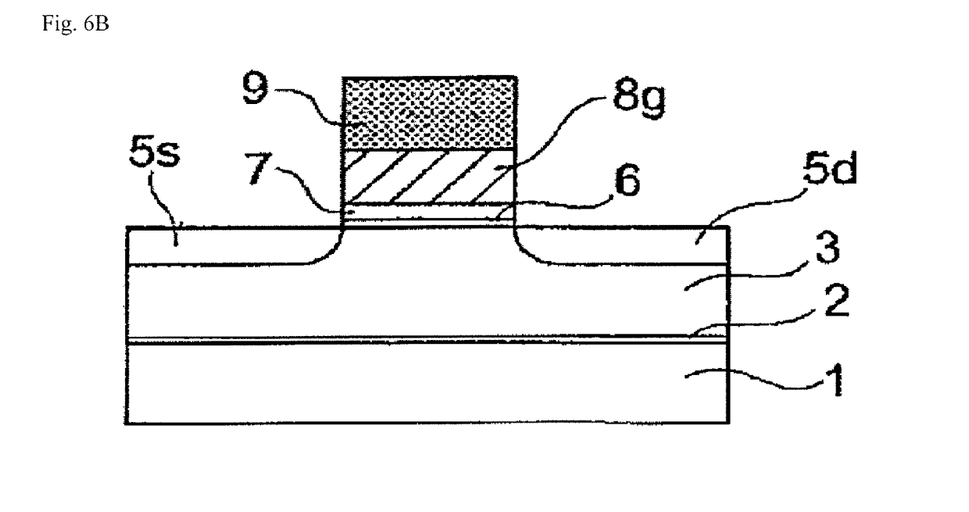
FIG. 6B is a view showing the process of producing the GaN-based semiconductor transistor according to the embodiment of the present invention.

Then, as shown in FIG. 6B, using the patterned photoresist 9 as a mask, etching is performed on the conductive film 8, the silicon oxide film 7, and the alumina film 6, and the conductive film 8 left on the gate region serves as the gate electrode 8g. The silicon oxide film 7 and the alumina film 6 under the gate electrode 8g serve as the gate insulating film.

Next, as shown in FIG. 6C, the photoresist 9 is removed, and then, as shown in FIG. 1, a source electrode 10s is formed on the source region 5s and simultaneously, a drain electrode 10d is formed on the drain region 5d, by a lift-off method using another photoresist (not shown). Each of the source electrode 10s and the drain electrode 10d is a film composed of, for example, Ti/Al, Ti/AlSi, Mo, or the like and is in ohmic contact with the n+-GaN layer that forms the drain region 5d and the source region 5s. Through the above processes, the semiconductor transistor 11 shown in FIG. 1 can be produced.

In the semiconductor transistor 11 of the embodiment, the gate insulating film was formed as a hybrid film composed of the first insulating film 6 and the second insulating film 7, in which the first insulating film 6 was made of one or more compounds selected from the group consisting of $Al_2O_3$, $HfO_2$, $ZrO_2$, $La_2O_3$, and $Y_2O_3$ and having a higher oxidization power than that of $SiO_2$, and the second insulating film 7 was made of $SiO_2$ as a compound having a wider band gap than the first insulating film 6.

Accordingly, in the semiconductor transistor 11, the interface characteristics between the GaN-based semiconductor and the gate insulating film are favorable due to the first insulating film 6, and a high breakdown voltage is obtained and the film characteristics of the gate insulating film are favorable due to the second insulating film 7. Therefore, the semiconductor transistor 11 has both favorable interface characteristics between the GaN-based semiconductor and the gate insulating film and favorable film characteristics of the gate insulating film.

It is envisaged that the semiconductor transistor 11 will be used, for example, as a power device for automobiles, home appliance power circuits, and the like, but not in an LSI of a so-called signal system. Thus, since the film thickness is increased as a result of using the hybrid film as the gate insulating film, the semiconductor transistor 11 can be suitably used as a power device.

Hereinabove, the present invention has been described based on a preferable embodiment. However, the semiconductor transistor according to the present invention is not restricted simply to the configuration of this embodiment. Various changes and modifications in the configuration of the embodiment are also encompassed in the scope of the invention.

The entire disclosure of Japanese Patent Application No. 2010-045547 is incorporated herein by reference.

All publications, patent applications, and technical standards described in the present specification are incorporated herein by reference to the same extent as if each publication, patent application, or technical standard was specifically and individually indicated to be incorporated by reference.

DESCRIPTION OF REFERENCE NUMERALS

1: Substrate
2: Buffer layer
3: Active layer
4, 9: Photoresist
5s: Source region
5d: Drain region
6: Alumina film (first insulating film)
7: Silicon oxide film (second insulating film)
8: Conductive film
8g: Gate electrode
10s: Source electrode
10d: Drain electrode
11: Semiconductor transistor

The invention claimed is:

1. A semiconductor transistor, comprising:
an active layer composed of a Mg-doped GaN-based semiconductor having an Mg concentration of from $1\times10^{16}/cm^3$ to $1\times10^{17}/cm^3$; and
a gate insulating film having
a first insulating film including one or more compounds selected from the group consisting of insulating films in which an absolute value of standard enthalpy of formation is larger than 228 kJ/mol, $Al_2O_3$, $HfO_2$, $ZrO_2$, $La_2O_3$, and $Y_2O_3$, and a second insulating film composed of $SiO_2$ directly on the first insulating film, wherein the first insulating film is directly on the active layer.

2. A semiconductor transistor, comprising:
an active layer made of a GaN-based semiconductor; and
a gate insulating film having
a first insulating film including $Al_2O_3$, directly on the active layer, and
a second insulating film composed of $SiO_2$ directly on the first insulating film.

3. The semiconductor transistor according to claim 1, wherein the absolute value of standard enthalpy of formation of the first insulating film is equal to or smaller than 318 kJ/mol.

4. The semiconductor transistor according to claim 2, wherein an absolute value of standard enthalpy of formation of the first insulating film is larger than 228 kJ/mol and equal to or smaller than 318 kJ/mol.

5. A semiconductor transistor, comprising:
an active layer comprising a Mg-doped GaN-based semiconductor having an Mg concentration of from $1\times10^{16}/cm^3$ to $1\times10^{17}/cm^3$; and
a gate insulating film having
a first insulating film including one or more compounds selected from the group consisting of $Al_2O_3$, $HfO_2$, $ZrO_2$, $La_2O_3$, and $Y_2O_3$, directly on the active layer, and
a second insulating film comprising $SiO_2$ directly on the first insulating film.

6. The semiconductor transistor of claim 1, further comprising:
a source feature embedded in the active layer; and
a drain feature embedded in the active layer.

7. The semiconductor transistor of claim 1, wherein a thickness of the first insulating layer is less than a thickness of the second insulating layer.

8. The semiconductor transistor of claim 1, wherein a thickness of the first insulating layer ranges from about 5 nanometers (nm) to about 10 nm.

9. The semiconductor transistor of claim 8, wherein a thickness of the second insulating layer ranges from about 50 nm to about 100 nm.

10. The semiconductor transistor of claim 2, further comprising:
a source feature embedded in the active layer; and
a drain feature embedded in the active layer.

11. The semiconductor transistor of claim 2, wherein a thickness of the first insulating layer is less than a thickness of the second insulating layer.

12. The semiconductor transistor of claim 2, wherein a thickness of the first insulating layer ranges from about 5 nanometers (nm) to about 10 nm.

13. The semiconductor transistor of claim 12, wherein a thickness of the second insulating layer ranges from about 50 nm to about 100 nm.

14. The semiconductor transistor of claim 5, further comprising:
a source feature embedded in the active layer; and
a drain feature embedded in the active layer.

15. The semiconductor transistor of claim 5, wherein a thickness of the first insulating layer is less than a thickness of the second insulating layer.

16. The semiconductor transistor of claim 5, wherein a thickness of the first insulating layer ranges from about 5 nanometers (nm) to about 10 nm.

17. The semiconductor transistor of claim 16, wherein a thickness of the second insulating layer ranges from about 50 nm to about 100 nm.

* * * * *